(12) United States Patent
Hopper et al.

(10) Patent No.: US 7,435,628 B1
(45) Date of Patent: Oct. 14, 2008

(54) METHOD OF FORMING A VERTICAL MOS TRANSISTOR

(75) Inventors: Peter J. Hopper, San Jose, CA (US); Yuri Mirgorodski, Sunnyvale, CA (US); Vladislav Vashchenko, Palo Alto, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/881,671

(22) Filed: Jul. 27, 2007

Related U.S. Application Data

(62) Division of application No. 10/728,132, filed on Dec. 4, 2003, now Pat. No. 7,259,411.

(51) Int. Cl.
  *H01L 21/00* (2006.01)
  *H01L 21/44* (2006.01)

(52) U.S. Cl. .................. 438/138; 438/134; 438/246; 438/259; 438/268; 438/270; 257/E21.149; 257/E21.151; 257/E21.384; 257/E21.444; 257/E21.629; 257/E29.131; 257/E29.165; 257/E21.201; 257/E21.214

(58) Field of Classification Search .......... 438/134, 438/138, 246, 259, 268, 270, 272, 589; 257/E21.149, 257/E21.151, E21.384, E21.418, E21.444, 257/E21, 629, E29.133, E29.165, E29.201, 257/E29.214
See application file for complete search history.

(56) References Cited

U.S. PATENT DOCUMENTS

| | | | |
|---|---|---|---|
| 4,750,023 A | 6/1988 | Shannon | 357/23.3 |
| 4,767,722 A | 8/1988 | Blanchard | 437/41 |
| 4,871,684 A | 10/1989 | Glang et al. | 437/31 |
| 5,034,785 A | 7/1991 | Blanchard | 357/23.4 |
| 5,073,519 A | 12/1991 | Rodder | 437/180 |
| 5,087,581 A | 2/1992 | Rodder | 437/41 |
| 5,170,243 A | 12/1992 | Dhong et al. | 365/208 |
| 5,504,359 A | 4/1996 | Rodder | 257/329 |
| 5,508,534 A * | 4/1996 | Nakamura et al. | 257/135 |
| 5,578,850 A | 11/1996 | Fitch et al. | 257/329 |
| 5,627,395 A | 5/1997 | Witek et al. | 257/350 |
| 5,648,283 A * | 7/1997 | Tsang et al. | 438/138 |
| 5,736,753 A | 4/1998 | Ohno et al. | 257/77 |
| 5,960,264 A * | 9/1999 | Takahashi | 438/133 |
| 5,963,800 A | 10/1999 | Augusto | 438/212 |
| 6,204,532 B1 | 3/2001 | Gambino et al. | 257/329 |
| 6,239,463 B1 | 5/2001 | Williams et al. | 257/328 |

(Continued)

OTHER PUBLICATIONS

Howard Pein and James D. Plummer, "Performance of the 3-D Pencil Flash EPROM Cell and Memory Array", IEEE Transactions on Electron Devices, vol. 42, No. 11, Nov. 1995, pp. 1982-1991.

(Continued)

*Primary Examiner*—Michael S Lebentritt
(74) *Attorney, Agent, or Firm*—Mark C. Pickering

(57) ABSTRACT

A vertical MOS transistor has a source region, a channel region, and a drain region that are vertically stacked, and a trench that extends from the top surface of the drain region through the drain region, the channel region, and partially into the source region. The vertical MOS transistor also has an insulation layer that lines the trench, and a conductive gate region that contacts the insulation layer to fill up the trench.

20 Claims, 6 Drawing Sheets

U.S. PATENT DOCUMENTS

| | | | |
|---|---|---|---|
| 6,337,497 B1 | 1/2002 | Hanafi et al. | 257/306 |
| 6,440,801 B1 | 8/2002 | Furukawa et al. | 438/272 |
| 6,504,210 B1 | 1/2003 | Divakaruni et al. | 257/344 |
| 6,525,375 B1 | 2/2003 | Yamaguchi et al. | 257/341 |
| 6,635,924 B1 * | 10/2003 | Hergenrother et al. | 257/328 |
| 6,639,301 B2 | 10/2003 | Andoh | 257/606 |
| 6,657,242 B1 | 12/2003 | Norstrom et al. | 257/197 |
| 6,670,673 B2 | 12/2003 | Sakakibara | 257/328 |
| 6,700,175 B1 * | 3/2004 | Kodama et al. | 257/489 |
| 6,777,288 B1 | 8/2004 | Padmanabhan et al. | 438/250 |
| 6,836,001 B2 | 12/2004 | Yamauchi et al. | 257/627 |
| 6,924,198 B2 * | 8/2005 | Williams et al. | 438/270 |
| 7,005,388 B1 | 2/2006 | Hopper et al. | 438/733 |
| 7,078,280 B2 * | 7/2006 | Chaudhry et al. | 438/156 |
| 7,132,321 B2 | 11/2006 | Kub et al. | 438/172 |
| 7,187,041 B2 * | 3/2007 | Mizokuchi et al. | 257/401 |

OTHER PUBLICATIONS

Howard Pein and James D. Plummer, "A 3-D Sidewall Flash EPROM Cell and Memory Array", Electron Device Letters, vol. 14 (8), 1993, pp. 415-417.

U. Simu et al., "Limits in Micro Replication of CVD Diamond By Modulating Technique", 1997, [online], [retrieved on Nov. 16, 2003]. Retrieved from the Internet: <URL:http://www.angstrom.uu.se/solidstatephysics/joakim/limits.pdf>. pp. 1-11, (note p. 5, col. 2, lines 15-23).

E. Hui et al., "Carbonized Parylene as a Conformal Sacrificial Layer", [online], [retrieved on Nov. 16, 2003]. Retrieved from the Internet: <URL:http://www.bsac.eecs.berkeley.edu/archive/users/hvi-elliot/pd/fsacpaper.pdf>. pp. 1-5 (unnumbered), (note p. 2, Process Characterization, first paragraph).

G. Stemme, "Fabrication of MEMS", [online]. [retrieved on Nov. 16, 2003], Retrieved from the Internet:<URL:http://mmadou.eng.vci.edu/PDF%20Files/Stemme%20Fabrication.pdf>. pp. 1-9 (unnumbered), (note p. 3.).

* cited by examiner

METHOD OF FORMING A VERTICAL MOS TRANSISTOR

This is a divisional application of application Ser. No. 10/728,132 filed on Dec. 4, 2003, now U.S. Pat. No. 7,259, 411, issued on Aug. 21, 2007.

BACKGROUND OF THE INVENTION

1. Field of the Invention

The present invention relates to MOS transistors and, more particularly, to a method of forming a vertical MOS transistor.

2. Description of the Related Art

A MOS transistor is a well-known semiconductor device that controls the magnitude of a current that flows through the transistor. The current typically flows horizontally, such as from the drain to the source of an NMOS transistor. MOS transistors can be used as both low-power and high-power devices.

DETAILED DESCRIPTION OF THE INVENTION

Figure 1A:
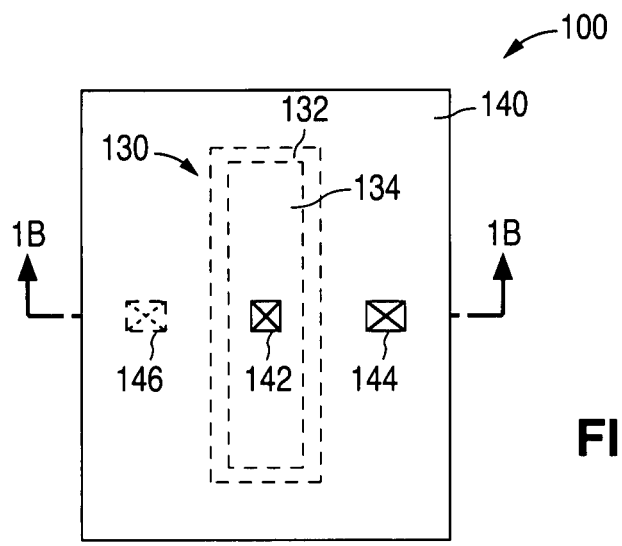
FIG. 1A is a plan view illustrating an example of a vertical MOS transistor 100 in accordance with the present invention.
Figure 1B:
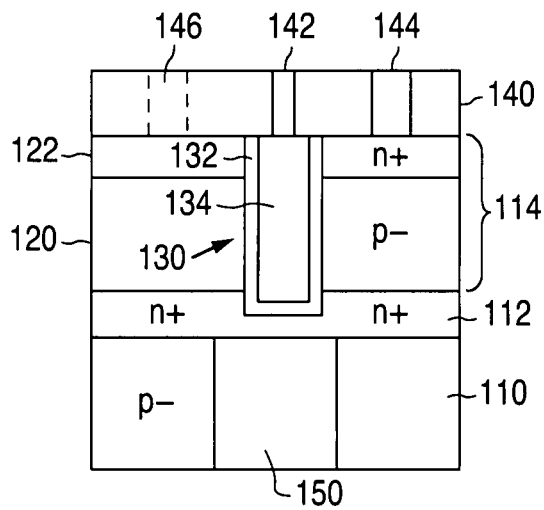
FIG. 1B is a cross-sectional view of transistor 100 taken along line 1B-1B of FIG. 1A.

FIG. 1A shows a plan view that illustrates an example of a vertical MOS transistor 100 in accordance with the present invention. FIG. 1B shows a cross-sectional view of transistor 100 taken along line 1B-1B of FIG. 1A. As described in greater detail below, transistor 100 provides a vertical current flow.

As shown in FIG. 1B, vertical MOS transistor 100 includes a p– silicon region 110, and an n+ region 112 that contacts the top surface of p– silicon region 110. P– silicon region 110 is formed to have a crystallographic orientation of <110>. In addition, p– silicon region 110 can be formed to have a depth of, for example, several hundred micrometers, while n+ region 112 can be formed to have a depth of, for example, one micrometer (1 μM).

As shown in FIGS. 1A-1B, transistor 100 includes an epitaxial layer 114 that is formed on n+ region 112. Epitaxial layer 114, which also has a crystallographic orientation of <110>, includes a p– region 120 that contacts n+ region 112, and an overlying n+ region 122 that contacts p– region 120. Epitaxial layer 114 can be formed to have a depth of, for example, three micrometers (3 μM). For example, p– region 120 can have a depth of two micrometers (2 μM), while n+ region 122 can have a depth of one micrometer (1 μM).

In addition to the above, transistor 100 also includes a trench 130 that extends from the top surface of n+ region 122 through n+ region 122, p– region 120, and partially into n+ region 112. Further, trench 130 is lined with a layer of insulation material 132, such as gate oxide, and filled with a conductive gate region 134. Conductive gate region 134 can be implemented with, for example, an n-type polysilicon region that has been predoped to achieve an appropriate work function difference to silicon, thereby achieving a practical threshold voltage.

As further shown in FIGS. 1A-1B, a layer of isolation material 140, such as a layer of oxide, can be formed over n+ region 122, insulation material layer 132 and gate region 134. In addition, a metallic contact 142 can be formed through isolation material 140 to make an electrical connection with gate region 134, and a metallic contact 144 can be formed through isolation material 140 to make an electrical connection with n+ region 122 on a first side of gate region 134.

Further, as shown by the dashed lines in FIGS. 1A-1B, a metallic contact 146 can optionally be formed through isolation material 140 to make an electrical connection with n+ region 122 on a second side of gate region 134 that lies opposite the first side. Additional metallic contacts can also be formed through isolation material 140 to make electrical connections with n+ region 122 and gate region 134.

Although not shown, a conventionally-formed interconnect structure, which includes metal traces and vias, is formed on contacts 142, 144, and 146 (and any additional contacts) such that a gate voltage can be applied to gate region 134 via contact 142 (and any additional contacts to gate region 134), and a source voltage can be applied to n+ region 122 via contact 144 (and any additional contacts to n+ region 122).

As additionally shown in FIGS. 1A-1B, transistor 100 includes a metallic plug 150, such as a copper or other metallic plug, that is formed through p– silicon region 110 to make an electrical connection with n+ region 112. Although not shown, metallic plug 150 is conventionally connected so that a drain voltage can be applied to metallic plug 150.

In operation, transistor 100 operates like a conventional MOS transistor except that current flows vertically adjacent to the sides of gate region 134. When a voltage difference exists between n+ region 122 and n+ region 112 and the gate voltage (which is applied to gate region 134) is equal to or greater than the threshold voltage, the channel region of p– region 120 that lies adjacent to gate region 134 inverts and a current flows from plug 150 to n+ region 112 to p– region 120 to n+ region 122 and on to contact 144. When the gate voltage falls below the threshold voltage, the current stops (except for a leakage current).

Figure 2:
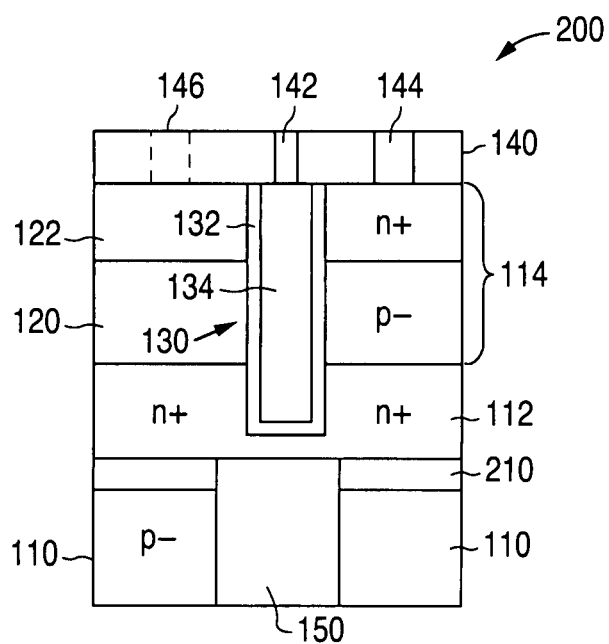
FIG. 2 is a cross-sectional view illustrating an example of a vertical MOS transistor 200 in accordance with the present invention.

FIG. 2 shows a cross-sectional view that illustrates an example of a vertical MOS transistor 200 in accordance with the present invention. FIG. 2 is taken along line 1B-1B of FIG. 1A. Transistor 200 is similar to transistor 100 and, as a result, utilizes the same reference numerals to designate the structures which are common to both transistors.

As shown in FIG. 2, transistor 200 differs from transistor 100 in that transistor 200 includes an insulator layer 210, such as a layer of oxide, that is formed between p– silicon region 110 and n+ region 112. Insulator layer 210 can represent the insulator layer in a silicon-on-insulator (SOI) structure.

One of the advantages of transistors 100 and 200 is that transistors 100 and 200 have a compact footprint which, in turn, allows a large number of transistors to be formed in parallel to form a high current, high power MOS transistor array in a relatively small surface area.

Figure 3A:
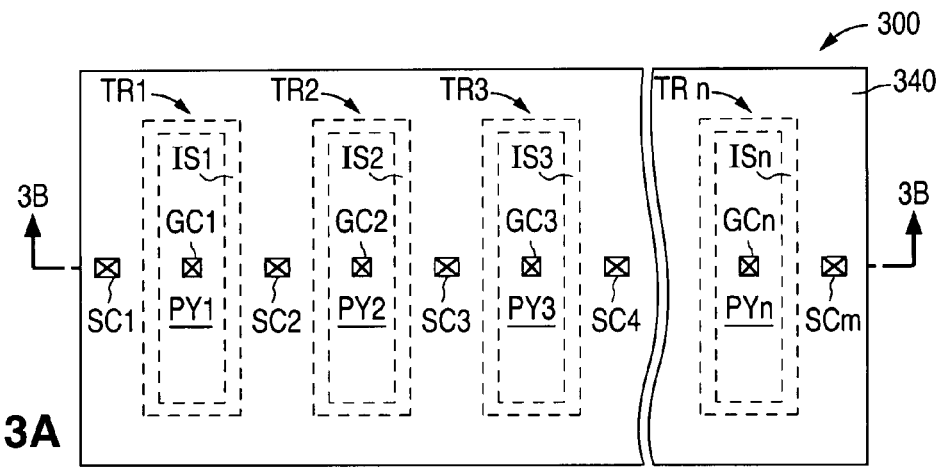
FIG. 3A is a plan view illustrating an example of a vertical MOS transistor array 300 in accordance with the present invention.
Figure 3B:
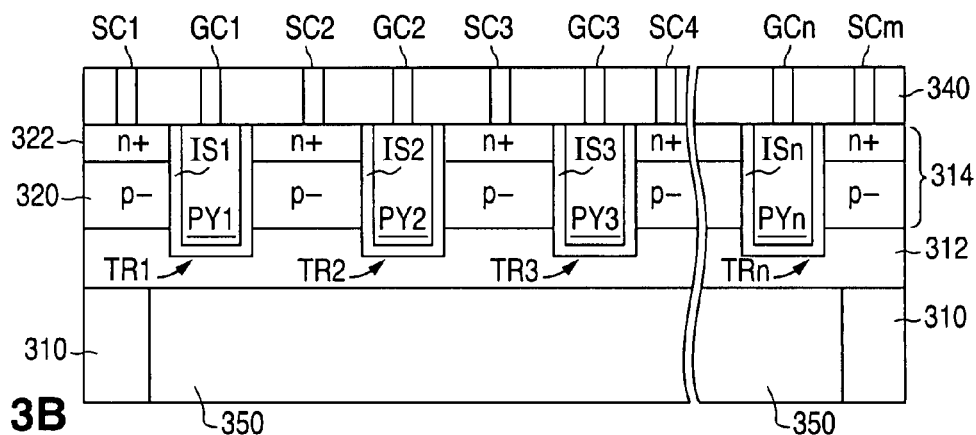
FIG. 3B is a cross-sectional view of array 300 taken along line 3B-3B of FIG. 3A.

FIG. 3A shows a plan view that illustrates an example of a vertical MOS transistor array 300 in accordance with the present invention. FIG. 3B shows a cross-sectional view of array 300 taken along line 3B-3B of FIG. 3A. As shown in FIG. 3B, transistor array 300 includes a p− silicon region 310, and an n+ region 312 that contacts the top surface of p− silicon region 310.

In addition, array 300 includes an epitaxial layer 314 that is formed on n+ region 312. Epitaxial layer 314, includes a p− region 320 that contacts n+ region 312, and an overlying n+ region 322 that contacts p− region 320. As above, p− silicon region 310 and epitaxial layer 314 are formed to have a crystallographic orientation of <110>. Further, regions 310, 312, 314, 320, and 322 can be the same as regions 110, 112, 214, 120, and 122 shown in FIGS. 1A and 1B.

Array 300 also includes a series of trenches TR1-TRn that each extend from the top surface of n+ region 322 through n+ region 322, p− region 320, and partially into n+ region 312. Further, array 300 includes a corresponding series of isolation regions IS1-ISn that line the trenches TR1-TRn, and a corresponding series of n+ conductive gate regions PY1-PYn that contact the isolation regions IS1-ISn, respectively, to fill the trenches TR1-TRn, respectively. As above, the conductive gate regions PY1-PYn can be implemented with, for example, n-type polysilicon that has been predoped to achieve an appropriate work function difference to silicon, thereby achieving a practical threshold voltage.

As also shown in FIGS. 3A-3B, a layer of insulation material 340, such as a layer of oxide, can be formed over n+ region 322, isolation regions IS1-ISn, and gate regions PY1-PYn. In addition, a series of gate contacts GC1-GCn can be formed through insulation material 340 to make an electrical connection with the gate regions PY1-PYn, and a series of source contacts SC1-SCm can be formed through insulation material 340 to make electrical connections with n+ region 322 adjacent to the gate regions PY1-PYn.

Additional metallic contacts can also be formed through insulation material 340 to make electrical connections with n+ region 322 and the gate regions PY1-PYn. Further, the arrangement of the gate and source contacts GC1-GCn and SC1-SCm are shown only for purposes of illustration. Other arrangements can also be used.

Although not shown, a conventionally-formed interconnect structure, which includes metal traces and vias, is formed on the gate and source contacts GC1-GCn and SC1-SCm such that a gate voltage can be applied to the gate contacts GC1-GCn, and a source voltage, such as ground, can be applied to the source contacts SC1-SCm.

As additionally shown in FIGS. 3A-3B, vertical MOS transistor array 300 includes a metallic plug 350, such as a copper or other metallic plug, that is formed through p− silicon region 310 to make an electrical connection with n+ region 312. Although not shown, a conventionally-formed interconnect structure is formed on metallic plug 350 such that a drain voltage can be applied to metallic plug 350.

In operation, array 300 operates like MOS transistor 100 except that current flows vertically adjacent to the sides of each gate region PY1-PYn. When a voltage difference exists between n+ region 322 and n+ region 312 and the gate voltage (which is applied to gate regions PY1-PYn) is equal to or greater than the threshold voltage, the channel regions of p− region 320 that lie adjacent to each gate region PY1-PYn invert and current flows from plug 350 to n+ region 312 to p− region 320 to n+ region 322 and on to source contacts SC1-SCm. When the gate voltage falls below the threshold voltage, the current stops (except for a leakage current).

Figure 4:
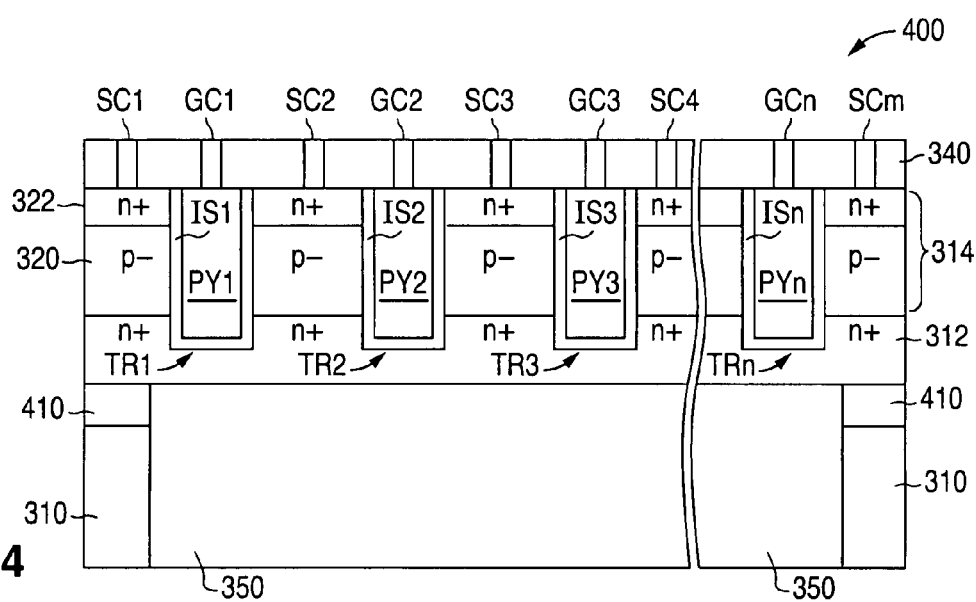
FIG. 4 is a cross-sectional view illustrating an example of a vertical MOS transistor array 400 in accordance with the present invention.

FIG. 4 shows a cross-sectional view that illustrates an example of a vertical MOS transistor array 400 in accordance with the present invention. FIG. 4 is taken along line 3B-3B of FIG. 3A. Array 400 is similar to array 300 and, as a result, utilizes the same reference numerals to designate the structures which are common to both transistors.

As shown in FIG. 4, array 400 differs from array 200 in that array 400 includes an insulator layer 410, such as a layer of oxide, that is formed between p− silicon region 310 and n+ region 312. Insulator layer 310 can represent the insulator layer in a silicon-on-insulator (SOI) structure.

One of the advantages of arrays 300 and 400 is that arrays 300 and 400 have low drain-to-source resistance turn on values (Rdson) due to plug 350 which provides the majority of the current path. In addition, plug 350 in arrays 300 and 400 reduces the amount of die surface area that is required by the transistors in a power array application.

Another advantage of arrays 300 and 400 of the present invention is that by creating trenches in the form of an array, the vertical MOS channels are controlled by a surrounding electric field. As a result, the intrinsic performance of the transistors in the present invention provides an increased sub-threshold performance capability. Thus, leakage versus drive current trade off performance can be better than a conventional MOS power transistor.

Figure 5A:
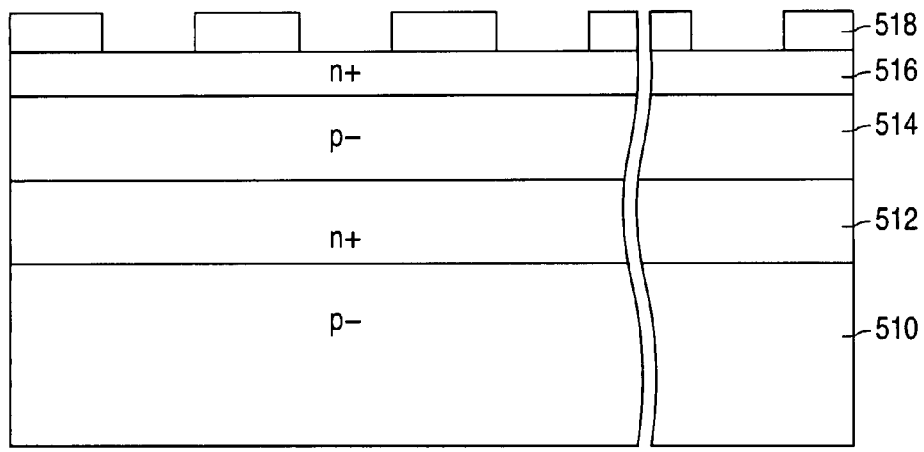
FIGS. 5A-5G are a series of cross-sectional views illustrating an example of a method of forming a vertical MOS transistor in accordance with the present invention.

FIGS. 5A-5G show a series of cross-sectional views that illustrate an example of a method of forming a vertical MOS transistor in accordance with the present invention. As shown in FIG. 5A, the method, which utilizes a p−single crystal silicon region 510 that has a <110> crystallographic orientation, includes the step of implanting the surface of silicon region 510 with an n-type dopant to form an n+ region 512. (Peripheral areas of region 510 which are not to be implanted are masked.)

Once n+ region 512 has been formed, a p− silicon region 514 is epitaxially grown on region 512 to have a depth of, for example, two micrometers (2 μM), and an n+ silicon region 516 is epitaxially grown on region 514 to have a depth of, for example, one micrometers (1 μM). Alternately, to minimize stacking faults, a p− region three micrometers (3 μM) can be epitaxially grown, followed by an n+ implant that forms n+ region 516 and defines p− region 514. Regions 514 and 516 both have a <110> crystallographic orientation. Next, a hard mask 518, such as a nitride mask, is formed and patterned on the top surface of n+ silicon region 516.

Figure 5B:
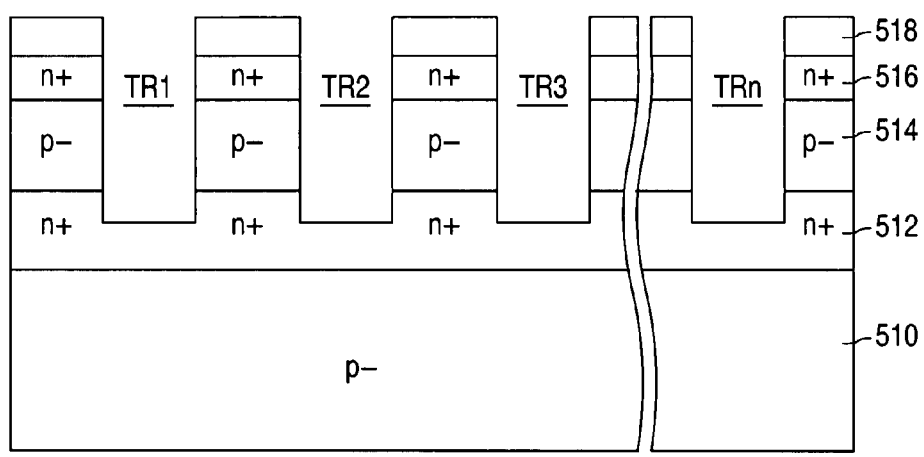

After this, as shown in FIG. 5B, the exposed regions of n+ silicon region 516 and the underlying regions are etched with a wet etchant, such as KOH (ethanol) or TMAH (tetramethylammonium hydroxide), to form a series of trenches TR1-TRn that each expose n+ region 512. A KOH etch is a relatively slow etch (e.g., 60 microns/hour), but when used to etch a <110> region of silicon, produces a series of very deep trenches, e.g., greater than three micrometers (>>3 μM) with substantially anisotropic side walls. Due to the time required to complete an etch, a production process would etch a number of wafers at the same time. Following the etch, mask 518 is removed.

Figure 5C:
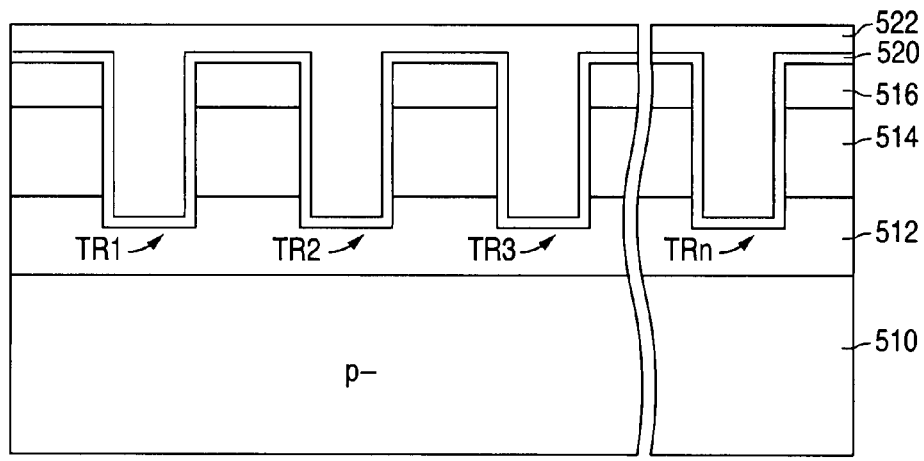

Next, as shown in FIG. 5C, a layer of insulation material 520, such as oxide, is formed on n+ region 512, p− region 514, and n+ region 516 to line the trenches TR1-TRn. Following this, a layer of conductive material 522 is formed on insulation layer 520 to fill up the trenches TR1-TRn. Conductive material 522 can be implemented with, for example, an n-type polysilicon material that has been predoped to achieve an appropriate work function difference to silicon, thereby achieving a practical threshold voltage.

Figure 5D:
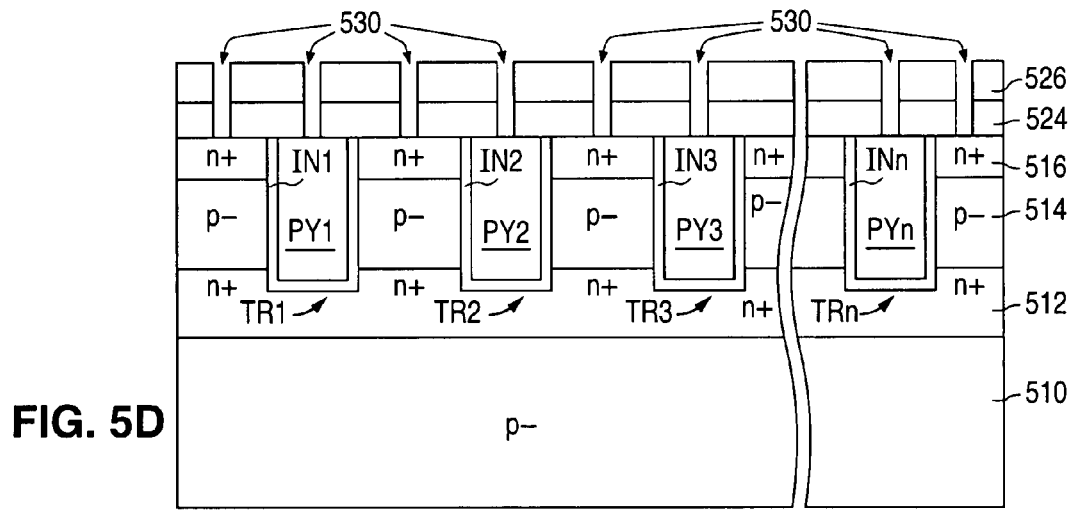

As shown in FIG. 5D, once conductive layer 522 has been formed, conductive layer 522 and insulation layer 520 are planarized until insulation layer 520 has been removed from the surface of n+ region 516. The planarization step forms a series of insulation regions IN1-INn that line the trenches TR1-TRn, respectively, and a series of conductive gate regions PY1-PYn that fill the trenches TR1-TRn, respectively.

After this, a layer of insulator material 524 is formed on n+ region 516, insulation regions IN1-INn, and conductive gate regions PY1-PYn. Next, a mask 526 is formed and patterned on insulator layer 524. The exposed regions of insulator layer 524 are then etched to expose the surfaces of n+ region 516 and gate regions PY1-PYn. The etch forms a number of contact openings 530. Mask 526 is then removed.

Figure 5E:
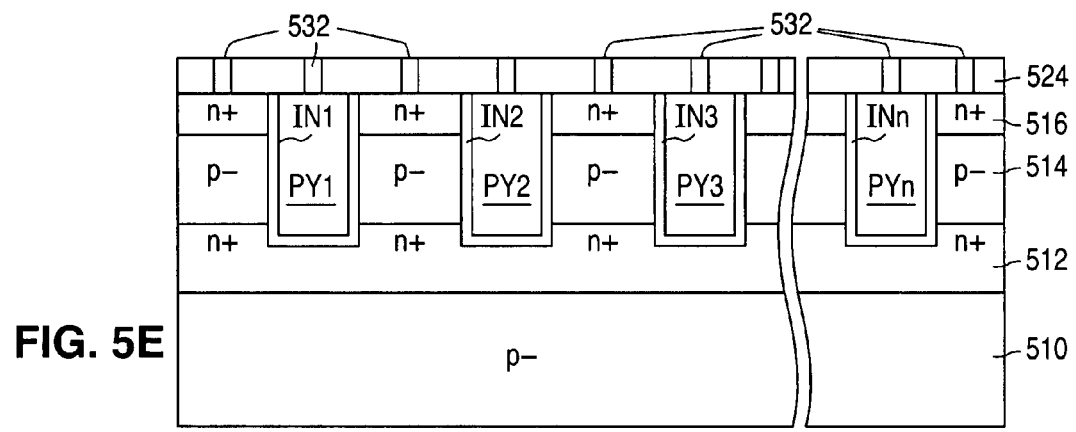

Following this, a layer of conductive material, which can include a diffusion barrier, is formed on insulator layer 524 to fill up the contact openings 530. As shown in FIG. 5E, the layer of conductive material is then planarized to remove the layer of conductive material from the top surface of insulator layer 524 and form a number of conductive contacts 532. An interconnect structure, which includes metal traces and vias, is then formed on insulator layer 524 to make electrical connections with the contacts 532.

Figure 5F:
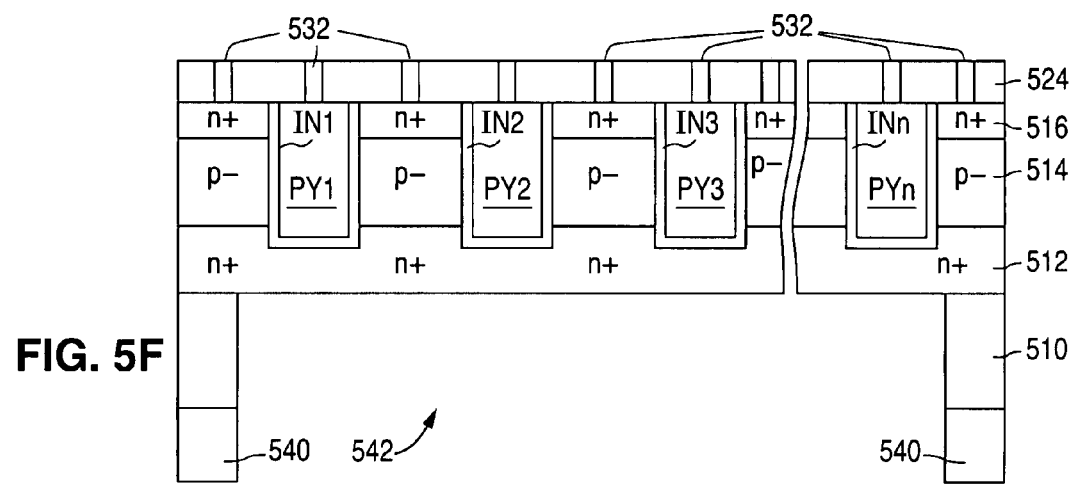

Next, as shown in FIG. 5F, a hard mask 540, such as nitride, is formed and patterned on the bottom surface of p− silicon region 510 (which can be ground down prior to the formation of mask 540). After this, the exposed region of p− silicon region 510 is etched with a wet etchant, such as KOH or TMAH, to form a trench 542 that exposes n+ region 512.

As noted above, a KOH etch is a relatively slow etch that can produce a very deep trench of, for example, greater than twenty five micrometers (>25 μM) with substantially anisotropic side walls when used to etch a <110> region of silicon. As further noted above, due to the time required to complete an etch, a production process would etch a number of wafers at the same time. Following the etch, mask 540 is removed and the surface is cleaned with an HF dip.

Figure 5G:
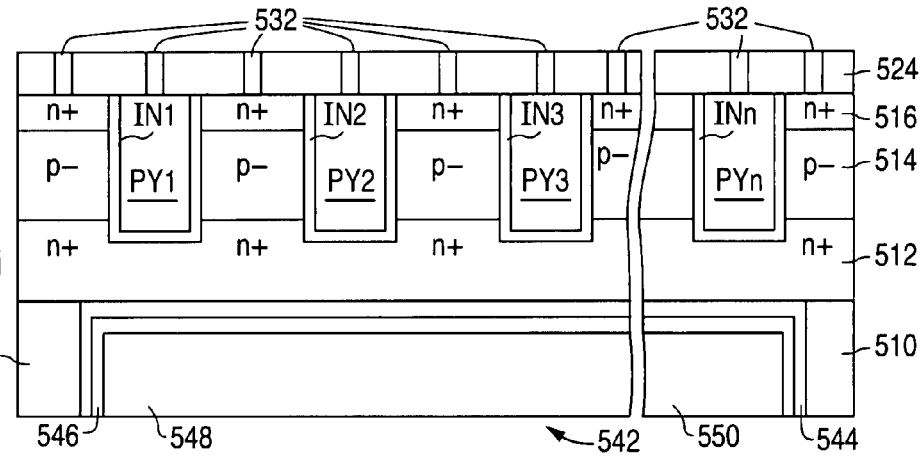

Next, as shown in FIG. 5G, a barrier layer 544 is formed on p− silicon region 510 and n+ region 512 to line trench 542. Once barrier layer 544 has been formed, a copper seed layer 546 is formed on barrier layer 544. Next, a conductive metal layer 548 is electroplated over seed layer 546 to fill up trench 542.

Conductive metal layer 548, seed layer 546, and barrier layer 544 are then planarized to remove barrier layer 544 from the bottom surface of p− silicon region 510 to form a conductive plug 550 that extends through p− silicon region 510 to make an electrical connection with n+ region 512.

Figure 6A:
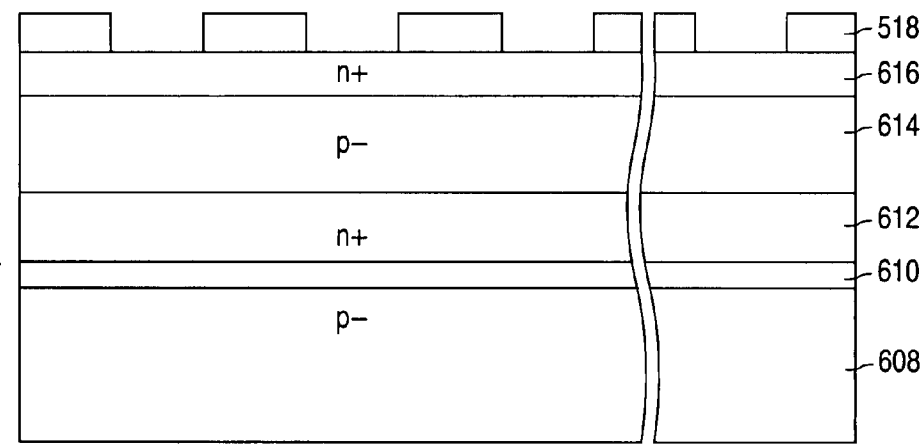
FIGS. 6A-6D are a series of cross-sectional views illustrating an example of a method of forming a vertical MOS transistor in accordance with the present invention.

FIGS. 6A-6D show a series of cross-sectional views that illustrate an example of a method of forming a vertical MOS transistor in accordance with the present invention. As shown in FIG. 6A, the method, which utilizes a p−single crystal silicon region 608 that has a <110> crystallographic orientation and an overlying layer of insulator material 610, includes the step of, in sequence, epitaxially growing an n+ region 612, a p− region 614, and an n+ region 616. Regions 612, 614 and 616 are grown to have depths of, for example, one micrometer (1 μM), two micrometers (2 μM), and one micrometer (1 μM), respectively.

Alternately, to minimize stacking faults, regions 612, 614, and 616 can be epitaxially grown in one or more steps using a lower dopant concentration, and then implanted to form n+ regions 612 and 616. For example, a p−epitaxial layer can be grown, followed by a first implant that forms n+ region 612 and a second implant that forms n+ region 616. Alternately, an n− epitaxial layer can be grown, and then implanted to form n+ region 612. Following this, a p− epitaxial layer can be grown, and then implanted to form n+ region 616 where p−region 614 lies between regions 612 and 616.

Figure 6B:
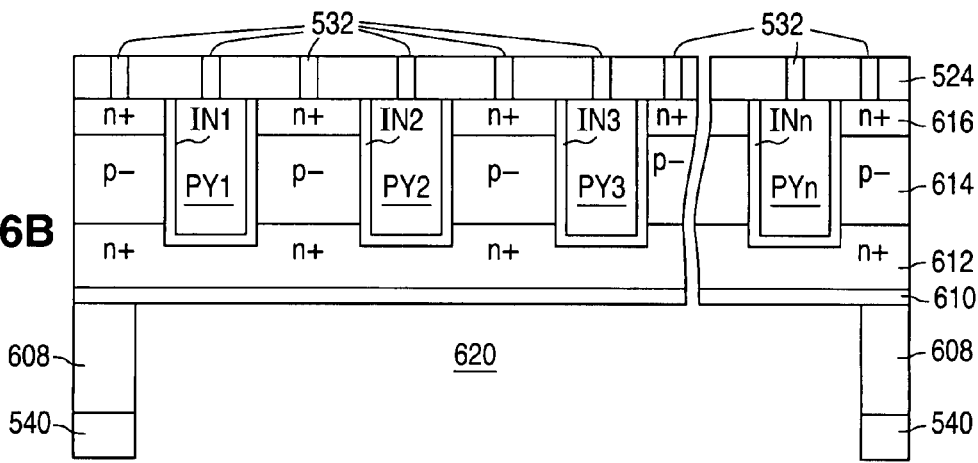

Following this, the method continues with the steps shown in FIGS. 5B-5F, beginning with the step of forming hard mask 518 on n+ region 616, and ending with the step of forming a hard mask 540 on the bottom surface of p− silicon region 608. After this, as shown in FIG. 6B, the exposed region of p− silicon region 608 is etched with a wet etchant, such as KOH or TMAH, to form a trench 620 that exposes insulator material 610. Thus, insulator material 610 can be utilized as an etch stop.

Figure 6C:
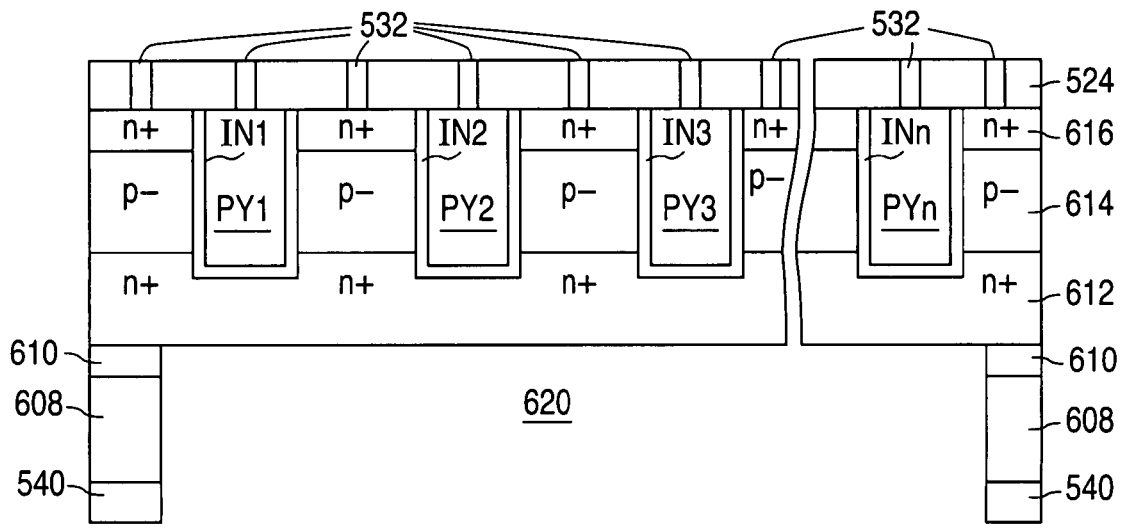
Figure 6D:
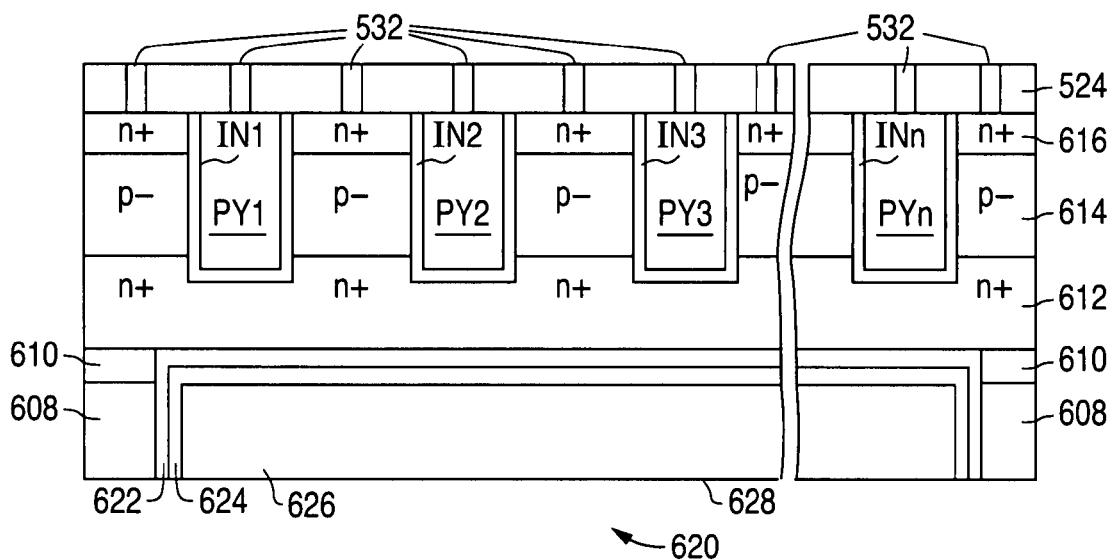

Next, as shown in FIG. 6C, the exposed region of insulator material 610 is etched, such as with an HF dip, to expose n+ region 612. Hard mask 540 is then removed. After this, as shown in FIG. 6D, a barrier layer 622 is formed on p− silicon region 608 and n+ region 612 to line trench 620. Once barrier layer 622 has been formed, a copper seed layer 624 is formed on barrier layer 622.

Next, a conductive metal layer 626 is electroplated over the seed layer to fill up trench 620. Conductive metal layer 626, seed layer 624, and barrier layer 622 are then planarized to remove barrier layer 622 from the bottom surface of p− silicon region 608 to form a conductive plug 628 that extends through p− silicon region 608 to make an electrical connection with n+ region 612.

One of the advantages of the methods illustrated by FIGS. 5A-5G and 6A-6D is that both methods can be easily integrated into a conventional buried-layer CMOS or BiCMOS fabrication process, with the formation of copper plug 350 being the only required additional steps to the methods.

It should be understood that the above descriptions are examples of the present invention, and that various alternatives of the invention described herein may be employed in practicing the invention. For example, metallic plugs 150 and 350 can be isolated from p− silicon regions 110 and 310, respectively so that metallic plugs 150 and 350 can have a voltage that is different from the voltage on p− silicon regions 110 and 310, respectively. Thus, it is intended that the following claims define the scope of the invention and that structures and methods within the scope of these claims and their equivalents be covered thereby.

What is claimed is:

1. A method of forming a transistor with a first region of a first conductivity type, the method comprising:
forming a second region of a second conductivity type that lies over the first region;
epitaxially growing a third region that contacts the second region, the third region having the first conductivity type; and
epitaxially growing a fourth region that contacts the third region, the fourth region having the second conductivity type and a top surface.

2. The method of claim 1 and further comprising:
forming a trench that extends from the top surface of fourth region through the fourth region, the third region, and partially into second region;
forming a layer of insulation material on the fourth region, the third region, and the second region;
forming a conductive material on the layer of insulation material to fill up the trench; and
planarizing the conductive material and the layer of insulation material until the layer of insulation material has been removed from the top surface of the fourth region to form an insulation region that lines the trench and a conductive gate region that contacts the insulation region and fills up the trench.

3. The method of claim 2 wherein the conductive gate region is a region of doped polysilicon.

4. The method of claim 2 and further comprising forming a plug through the first region to contact the second region.

5. The method of claim 4 wherein the plug is metallic.

6. A method of forming a transistor comprising:
   forming a first region of a first conductivity type to touch a semiconductor material of a second conductivity type, the first region having a dopant concentration;
   forming a second region of the second conductivity type to touch and lie over the first region; and
   forming a third region of the first conductivity type to touch and lie over the second region, the third region having a dopant concentration substantially equal to the dopant concentration of the first region.

7. The method of claim 6 and further comprising forming a trench to extend from a top surface of the third region through the second region and partially into the first region.

8. The method of claim 7 and further comprising forming a layer of insulation material to touch the third region, the second region, and the first region, the layer of insulation material lining the trench.

9. The method of claim 8 and further comprising forming a conductive material to touch the layer of insulation material and lie within the trench.

10. The method of claim 9 and further comprising removing the conductive material and the layer of insulation material from the top surface of the third region to form a gate insulation region that lines the trench and a conductive gate region that lies within the trench and touches the gate insulation region.

11. The method of claim 10 and further comprising forming an opening in the semiconductor material that extends from a bottom surface of the semiconductor material to the first region, the opening being spaced apart from the gate insulation region.

12. The method of claim 11 and further comprising forming a conductive region within the opening that touches the first region.

13. The method of claim 7 wherein the second region is epitaxially grown.

14. The method of claim 6 and further comprising forming a plurality of trenches that each extends from a top surface of the third region through the second region and partially into the first region.

15. The method of claim 14 and further comprising forming a layer of insulation material that touches the third region, the second region, and the first region, the layer of insulation material lining the plurality of trenches.

16. The method of claim 15 and further comprising forming a conductive material that touches the layer of insulation material.

17. The method of claim 16 and further comprising removing the conductive material and the layer of insulation material from the top surface of the third region to form a plurality of gate insulation regions that line the plurality of trenches, and a plurality of conductive gate regions that touch the plurality of gate insulation regions and lie within the plurality of trenches.

18. The method of claim 17 and further comprising forming an opening in the semiconductor material that extends from a bottom surface of the semiconductor material to the first region, the opening being spaced apart from each of the plurality of gate insulation regions.

19. The method of claim 18 and further comprising forming a conductive region within the opening that touches the first region.

20. The method of claim 14 wherein the second region is epitaxially grown.

* * * * *

UNITED STATES PATENT AND TRADEMARK OFFICE
CERTIFICATE OF CORRECTION

| | | |
|---|---|---|
| PATENT NO. | : 7,435,628 B1 | Page 1 of 1 |
| APPLICATION NO. | : 11/881671 | |
| DATED | : October 14, 2008 | |
| INVENTOR(S) | : Hopper et al. | |

It is certified that error appears in the above-identified patent and that said Letters Patent is hereby corrected as shown below:

Title Page,

Item (56), Page 2, Column 2, Other Publications,

Line 5, delete "Modulating" and replace with --Moulding--.

Signed and Sealed this

Twenty-fifth Day of November, 2008

JON W. DUDAS
*Director of the United States Patent and Trademark Office*